(12) United States Patent
Brcka et al.

(10) Patent No.: US 6,652,711 B2
(45) Date of Patent: Nov. 25, 2003

(54) INDUCTIVELY-COUPLED PLASMA PROCESSING SYSTEM

(75) Inventors: Jozef Brcka, Gilbert, AZ (US); John Drewery, Alameda, CA (US); Michael Grapperhaus, Gilbert, AZ (US); Gerrit Leusink, Tempe, AZ (US); Glyn Reynolds, Gilbert, AZ (US); Mirko Vukovic, Gilbert, AZ (US); Tugrul Yasar, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 74 days.

(21) Appl. No.: 09/875,339

(22) Filed: Jun. 6, 2001

(65) Prior Publication Data

US 2002/0185229 A1 Dec. 12, 2002

(51) Int. Cl.[7] .............................. C23F 1/00; C23C 16/00
(52) U.S. Cl. .............................. 156/345.48; 118/723 AN
(58) Field of Search ...................... 118/723 I, 723 IR, 118/723 AN; 156/345.48, 345.49; 315/111.51; 204/298.06, 298.11, 298.34

(56) References Cited

U.S. PATENT DOCUMENTS

| | | | |
|---|---|---|---|
| 5,226,967 A | 7/1993 | Chen et al. ................ 118/723 |
| 5,346,578 A | * 9/1994 | Benzing et al. ........ 156/345.48 |
| 5,522,934 A | 6/1996 | Suzuki et al. ............... 118/723 |
| 5,683,548 A | 11/1997 | Hartig et al. ............. 156/643.1 |
| 5,964,949 A | 10/1999 | Savas ......................... 118/723 |
| 5,982,100 A | 11/1999 | Ghanbari ................ 315/111.21 |
| 6,132,551 A | * 10/2000 | Horioka et al. ........ 156/345.48 |
| 6,220,201 B1 | 4/2001 | Nowak et al. .............. 118/723 |
| 6,417,626 B1 | * 7/2002 | Brcka et al. ............ 315/111.51 |
| 6,494,998 B1 | * 12/2002 | Brcka ..................... 204/192.12 |

FOREIGN PATENT DOCUMENTS

| | | | |
|---|---|---|---|
| EP | 0838841 | 4/1998 | ............ H01J/37/32 |
| EP | 0845800 | 6/1998 | ............ H01J/37/32 |
| JP | 6196446 | 7/1994 | |
| WO | WO 99/25494 | 5/1999 | ............. B08B/7/00 |
| WO | WO 99/53120 | 10/1999 | ............. C23F/1/02 |
| WO | WO 01/13403 | 2/2001 | ............ H01J/37/32 |

* cited by examiner

Primary Examiner—Luz Alejandro-Mulero
(74) Attorney, Agent, or Firm—Wood, Herron & Evans, L.L.P.

(57) ABSTRACT

A plasma processing system efficiently couples radiofrequency energy to a plasma confined within a vacuum processing space inside a vacuum chamber. The plasma processing system comprises a frustoconical dielectric window, an inductive element disposed outside of the dielectric window, and a frustoconical support member incorporated into an opening in the chamber wall. The support member has a frustoconical panel that mechanically supports a frustoconical section of the dielectric window. The dielectric window is formed of a dielectric material, such as a ceramic or a polymer, and has a reduced thickness due to the mechanical support provided by the support member. The processing system may include a gas source positioned above the substrate support for introducing the process gas into the vacuum processing space.

29 Claims, 9 Drawing Sheets

INDUCTIVELY-COUPLED PLASMA PROCESSING SYSTEM

FIELD OF THE INVENTION

This invention relates generally to plasma processing systems and, more particularly, relates to inductively-coupled plasma processing systems for cleaning a substrate surface before depositing a coating material.

BACKGROUND OF THE INVENTION

Plasmas are widely used in materials processing for treating the surfaces of substrates, such as semiconductor wafers and flat panel displays, prior to a processing step. In particular, plasmas are used to remove native oxide layers and other contaminants from the substrate surface in preparation for a subsequent deposition of a film of coating material, such as a metallization layer, onto the surface. If the contaminants were not removed by a pre-deposition cleaning process, the physical characteristics, such as the electrical and mechanical properties, of the interface between the layer of coating material and the substrate would be adversely affected.

A conventional approach for removing contaminants is to expose the substrate surface to a plasma in a plasma cleaning step before depositing the film of coating material. The plasma cleaning step may rely on a plasma as a source of reactive species that chemically react with the contamination to form volatile or quasi-volatile products. For example, oxidation can be cleaned from copper metallization on a substrate surface using a hydrogen-containing plasma that chemically reduces the oxide to form volatile etch products. Alternatively, the plasma cleaning step may rely on sputtering due to ion bombardment for cleaning contamination from the substrate surface. For example, oxidation can be removed from aluminum metallization by bombarding the substrate surface with energetic ions from a plasma generated from a noble process gas. Other plasma cleaning steps combine chemical and physical mechanisms for removing contamination from the substrate surface by bombarding the substrate surface with energetic chemically-active plasma species. Preferably, the plasma cleaning removes contaminants from the surface without causing damage or altering the properties of any existing film residing on the surface.

Conventional plasma processing systems designed for plasma cleaning or plasma etching have a vacuum chamber that incorporates a window formed of a dielectric material, such as quartz, and an antenna adjacent the non-vacuum side of the window. Radiofrequency (RF) energy is coupled from the antenna through the dielectric material of the window to the plasma. In certain conventional plasma processing systems, the dielectric window is a bell jar of dielectric material which is sealed to a metal chamber base to define a vacuum chamber. In other conventional plasma processing systems, the dielectric window is a cylindrical or planar structural wall section of dielectric material incorporated into the chamber wall of the vacuum chamber.

Conventional plasma processing systems that utilize a plasma for cleaning substrate surfaces have certain significant disadvantages. In particular, contaminant material sputtered from the substrate surface tends to travel in line-of-sight paths from the substrate toward the interior surfaces of the vacuum chamber. The sputtered contaminant material accumulates, possibly along with chemically-active species originating from the plasma and volatile or quasi-volatile species removed from the substrate surface, as a residue or buildup on interior surfaces, such as the vacuum-side surface of the dielectric window. The residues generated by processing can flake and break off as small particles that are a source of particulate matter detrimental to the fabrication of semiconductor devices. In particular, the residue has a particularly poor adhesion to the surface of the dielectric window. When the plasma is extinguished, the particulate matter can be electrostatically attracted to the substrate. Alternatively, small particles of particulate matter can grow in size while suspended within the plasma and, when the plasma is extinguished, fall under the influence of gravity to the substrate. Such particulate matter may locally compromise the quality of the coating material subsequently deposited on the substrate surface and, thereby, act as defects that reduce device yield.

The accumulation of metal on the dielectric window is a particularly acute problem if the substrates to be sputter cleaned have a significant surface coverage of metal. In particular, the sputter cleaning of metal-covered surfaces produces relatively large accumulations of contaminant residue which serves as a potential source of particulate matter. Moreover, sputtered metal that accumulates on the vacuum-side surface of the dielectric window can affect the operation of the plasma processing system. If the residue is conductive, currents circulating in the buildup tend to reduce the effectiveness of the coupling of RF energy from the antenna to the plasma. Even if the accumulated metal is highly resistive and not limiting of the coupling of the RF energy, the metal residue on the dielectric window can still inhibit plasma ignition and decrease the efficiency of radiofrequency power transmission through the window.

To reduce the occurrence of particulate matter and to maintain efficient coupling of RF energy, the vacuum-side of the dielectric window must be periodically cleaned by chemical and/or abrasive techniques to remove the accumulated residue. Cumulative damage from successive cleanings gradually degrades the mechanical properties of the dielectric material forming the window. As a result, the service life of the dielectric window is reduced and the likelihood of a premature catastrophic failure is enhanced. Typically, the dielectric window is removed from service when the mechanical properties are degraded such that the window can no longer safely support the load applied by atmospheric pressure to the non-vacuum side of the window.

Electron temperature and plasma uniformity are important factors that are balanced such that the plasma distribution is relatively uniform at an operating pressure where the electron temperature is not excessive. Non-uniform plasma densities and excessive electron temperatures can damage the substrates. Asymmetries in the plasma density distribution can result in non-uniform etching or cleaning of the substrates. Although the electron temperature can be reduced by raising the operating pressure of the process gas in the vacuum chamber, the increased operating pressure frequently reduces the uniformity of the plasma density distribution.

The geometry of the vacuum chamber system is another important factor in determining plasma density and plasma uniformity. Ultimately, the processing uniformity over the surface area of the substrate is directly related to the uniformity of the plasma adjacent to the exposed surface of the substrate. Furthermore, in conventional plasma processing systems that utilize chemical activity during treatment, the concentration of chemically-active species from the plasma is depleted near the substrate center and increased near the substrate's peripheral edge due to gas flow inhomogeneities. This nonuniformity enhances treatment rates at the substrate periphery than at the substrate center, resulting in high center-to-edge nonuniformity. The asymmetrical treatment due to non-uniform plasmas and inhomogeneous concentrations of chemically-active species from the plasma is compounded for large-diameter substrates, such as 300 mm silicon wafers.

Conventional plasma processing systems must be optimized to accommodate large-diameter wafers. For example, to provide a uniformly-distributed plasma near the substrate, the footprint of the antenna and the associated dielectric window must be increased and the plasma source-to-substrate separation distance must be increased. To achieve an acceptable plasma uniformity with a reasonable electron temperature in a large-diameter substrate plasma processing system, the cost of manufacturing the dielectric window increases significantly.

Dielectric windows for large-diameter substrate plasma processing systems face certain technological challenges when the processing system is optimized. As mentioned above, atmospheric pressure applies a significant force distributed over the area of the non-vacuum or ambient side of the dielectric window. Accordingly, the dielectric window must have a thickness that can withstand the applied force or load due to the pressure differential existing between the interior and exterior of the vacuum chamber. For example, the thickness of a 35-centimeter (cm) diameter planar dielectric window, which might be appropriate for processing a 300 mm wafer, must be able to withstand an applied force of about 2200 pounds (lbs) arising from standard atmospheric pressure of 14.7 pounds per square inch acting over the area of the window.

Ceramic dielectric materials are generally brittle and prone to failure under an applied load. The ceramic material forming the dielectric window must be rather thick to withstand the force applied by atmospheric pressure. Thick dielectric windows reduce the efficiency of the coupling with the plasma due to attenuation of RF power in traversing the breadth of the window. Thus, the transfer of RF energy from the antenna to the plasma is inefficient in plasma processing systems having conventional planar dielectric windows. To compensate for the inefficiency, the RF power source must be operated at significantly elevated power levels to increase the RF current delivered to the antenna and provide an acceptable RF power to the plasma. However, the passage of an increased RF current through the antenna increases the Joule heating, which may be adverse to the performance and operation of the plasma processing system if the heat energy is not adequately dissipated.

Conventional plasma processing systems require a uniform distribution of process gas to achieve a uniform plasma distribution. The uniformity of the plasma distribution is adversely affected by asymmetrical distribution of the process gas into and within the vacuum chamber. Generally, gas distribution is affected by both the flow of process gas into the vacuum chamber and the pumping of process gas out of the vacuum chamber. In particular, the distribution of the plasma density is highly sensitive to the uniformity of the gas flow. Furthermore, the uniformity of the distribution of various plasma species can be affected by the distribution of the process gas.

As a result of the above and other considerations and problems, there remains a need for an plasma processing system that efficiently couples radiofrequency energy to the plasma and that can provide a plasma with spatial uniformity for uniformly etching or cleaning the exposed surfaces of substrates, and in particular, the exposed surfaces of large-diameter substrates.

SUMMARY OF THE INVENTION

According to the principles of the present invention, a plasma processing system has a vacuum chamber with a chamber wall which surrounds a vacuum processing space. A gas inlet is provided in the chamber wall for introducing a process gas into the vacuum processing space. A substrate support is positioned within the vacuum processing space and is adapted to receive and support a substrate. The plasma processing system is provided with a support member positioned in an opening in the chamber wall. A frustoconical panel of the support member, which is configured to allow radiofrequency (RF) energy to enter the vacuum processing space, mechanically supports a frustoconical section of a dielectric window. An antenna is positioned adjacent to the frustoconical section of the dielectric window and is electrically connected to an RF power supply. The antenna is capable of providing RF energy for transmission through the dielectric window to the vacuum processing space for forming a plasma from the process gas therein.

In one aspect of the present invention, the dielectric window may be formed from a dielectric material such as aluminum oxide, aluminum nitride, silicon nitride, borosilicate glass or quartz. Alternatively, the dielectric material of choice may be a polymer or, more particularly, the polymer may be a polytetrafluoroethylene (PTFE) or a filled PTFE.

In another aspect of the present invention, the frustoconical panel of the deposition baffle extends upwardly with an included angle greater than or equal to 25°. Preferably, the included angle is about 60°.

In certain embodiments of the present invention, a plasma processing system further includes a gas source positioned above the substrate support, integral with the support member, and is in fluid communication with the gas inlet. The gas source supplies a flow of the process gas at multiple locations into the vacuum processing space, wherein the process gas is energized by the RF energy to form a plasma. The gas source may comprise an internal gas passageway disposed within the deposition baffle and a plurality of gas ports provided in the internal gas passageway for emitting the flow of the process gas above the substrate support. Alternatively, the gas source may comprise a gas distribution plate having a gas plenum and a plurality of gas ports therein for emitting the flow of the process gases above the substrate support. In yet another alternative, the gas source comprises a gas distribution ring having a plurality of gas ports therein for emitting the flow of the process gases into the vacuum processing space above the substrate support.

According to the present invention, the frustoconical section of the dielectric window is mechanically supported by a frustoconical panel of the deposition baffle so that the thickness of dielectric material can be reduced and still withstand the force applied by atmospheric pressure acting on the window. As a result of the reduction in thickness, the transfer of RF energy from the antenna through the dielectric window to the plasma is more efficient. In addition, the cost to manufacture the dielectric window is significantly decreased by the reduction in the required thickness of the dielectric material. Moreover, the support member of the present invention includes slots configured to shield the dielectric window from the buildup of sputtered etch products, which could otherwise flake and break to create particulate matter or could reduced the efficiency of the transfer of RF energy. The use of one or more of a gas distribution plate, a gas ring, or gas passageways in the support member significantly improves the spatial distribution of the flow of process gas into the vacuum chamber and, thereby, enhances the uniformity and symmetry of the plasma density. The frustoconical shape of the plasma source significantly reduces or eliminates gas recirculation zones to lessen the generation of particulate matter. Forming the dielectric window of PTFE or a filled PTFE significantly decreases the cost of the window. Further, because PTFE is significantly less brittle than ceramic dielectric materials, the likelihood of a catastrophic window failure is significantly reduced.

BRIEF DESCRIPTION OF THE DRAWINGS

The accompanying drawings, which are incorporated in and constitute a part of this specification, illustrate embodiments of the present invention and, together with a detailed description of the invention given below, serve to explain the present invention. In the drawings wherein like reference numerals represent like parts.

DETAILED DESCRIPTION OF THE INVENTION

The present invention relates to the inductive coupling of radiofrequency (RF) energy into a vacuum chamber, to initiate and sustain an inductively coupled plasma for processing substrates and, in particular, for cleaning substrates. The plasma processing systems of the present invention are useful for cleaning the surfaces of substrates and, in particular, for cleaning the surfaces of large-diameter semiconductor substrates, such as 300-mm semiconductor wafers. As used herein, semiconductor substrate includes any construction comprising a semiconductive material, such as a semiconductive wafer, either alone or in constructs comprising other materials thereon, and semiconductive material layers, either alone or in constructs comprising other materials. Substrate refers to any supporting structure including but not limited to semiconductor substrates.

The present invention enhances the efficiency of RF energy transfer to the vacuum chamber for coupling with the plasma, reduces particle production, and reduces the frequency of required maintenance or cleaning cycles to remove buildup from the dielectric window. As a result, the present invention provides uniform and reproducible sequential processing of substrates while allowing extremely long continuous processing runs between shut downs for maintenance activities and cleaning.

In particular, the plasma processing systems of the present invention provide mechanical support for the dielectric window such that the window does not have to be self-supporting against the force or load applied by atmospheric pressure against the non-vacuum side thereof. Because of the mechanical support, the thickness of the dielectric window can be significantly reduced. As a result, the RF energy must penetrate a reduced thickness of dielectric material to enter the vacuum chamber and, thereby, the efficiency of the inductive coupling from the RF source to a plasma confined within the vacuum chamber is increased. Moreover, the present invention shields the dielectric window for reducing the buildup of sputtered etch products so that the dielectric window requires less frequent cleaning. Because the sputtered etch products accumulate on the metal of the deposition baffle rather than the dielectric material of the dielectric window, an accumulated buildup of sputtered etch products is less likely to flake and break off and, as a result, particulate matter is reduced in the plasma processing system. Furthermore, according to aspects of the present invention, the spatial distribution of process gas flow into the vacuum chamber is improved to enhance the uniformity and symmetry of the plasma density. The present invention also significantly reduces or eliminates gas recirculation zones, which are known to exacerbate particulate matter production in chemically-assisted plasma cleaning.

Figure 1:
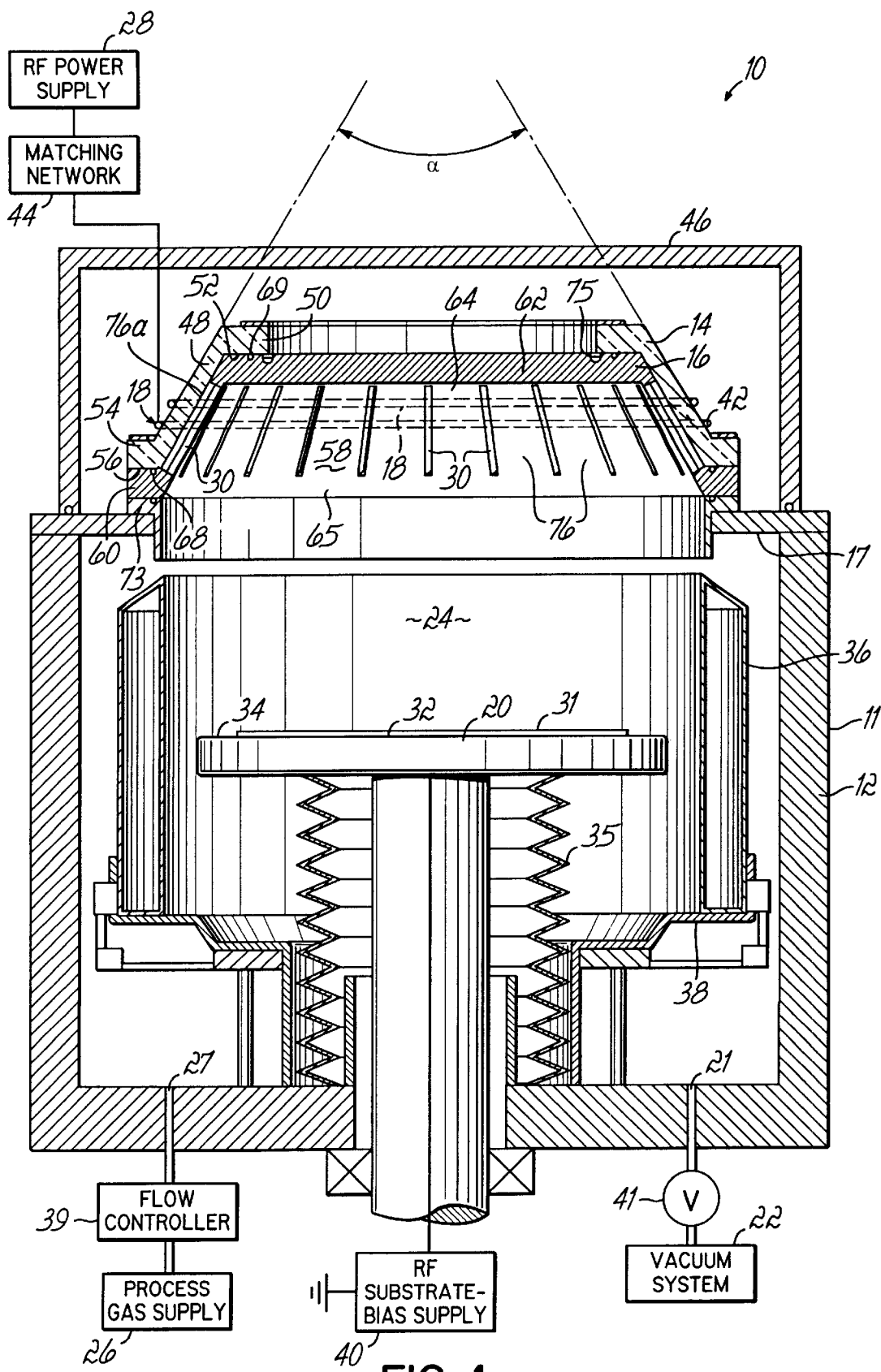
FIG. 1 is a side cross-sectional view of a plasma processing system of the present invention.
Figure 2:
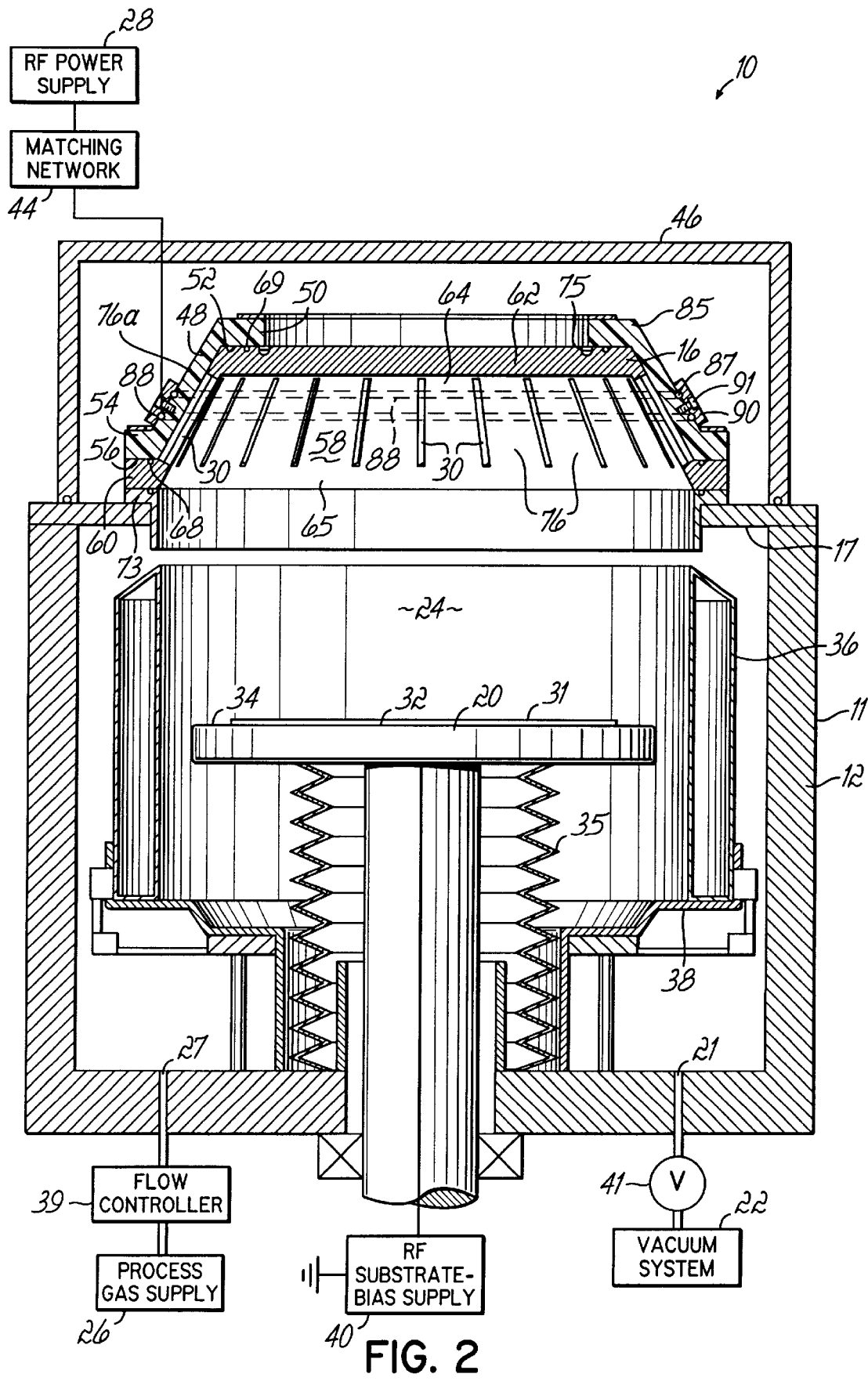
FIG. 2 is a side cross-sectional view, similar to FIG. 1, of an alternative embodiment of the present invention.

Referring to FIGS. 1 and 2 and according to one embodiment of the present invention, a plasma processing system 10 includes a vacuum chamber 11 having a chamber wall 12, a dielectric window 14, and a deposition baffle 16 positioned in an opening provided in a ceiling portion 17 of the chamber wall 12, an inductive element or antenna 18 positioned on a non-vacuum side of the dielectric window 14, and a substrate support 20 disposed inside the vacuum chamber 11. Connected to a vacuum port 21 provided in the chamber wall 12 is a vacuum system 22, including suitable vacuum pumps and isolation valves as are known in the art, for evacuating a vacuum processing space 24 enclosed by the chamber wall 12. A process gas supply 26 selectively supplies a flow of a process gas through a gas inlet 27 into the vacuum processing space 24. A radiofrequency (RF) power supply 28 is electrically connected via matching network 44 to the antenna 18 for selectively providing RF power to establish a time-varying current therein. The antenna 18 radiates a magnetic field that penetrates the thickness of the dielectric window 14 and a substantially parallel array of slots 30 provided in the deposition baffle 16. The magnetic field of the RF energy ionizes the process gas within the vacuum processing space 24 for initiating and sustaining a plasma therefrom primarily and preferably by inductive coupling. Inductive coupling of RF energy creates a high-density, low-energy plasma that is used to process an exposed surface 31 of a substrate 32 positioned on the substrate support 20. In particular, the plasma may be used to remove contaminants, such as an oxide, from the exposed surface 31 of substrate 32 in preparation for a subsequent deposition of a film of a coating material. Substrates 32 cleaned in the plasma processing system 10 may be transferred under a controlled atmosphere from the vacuum chamber 11 to a deposition chamber (not shown).

Figure 1A:
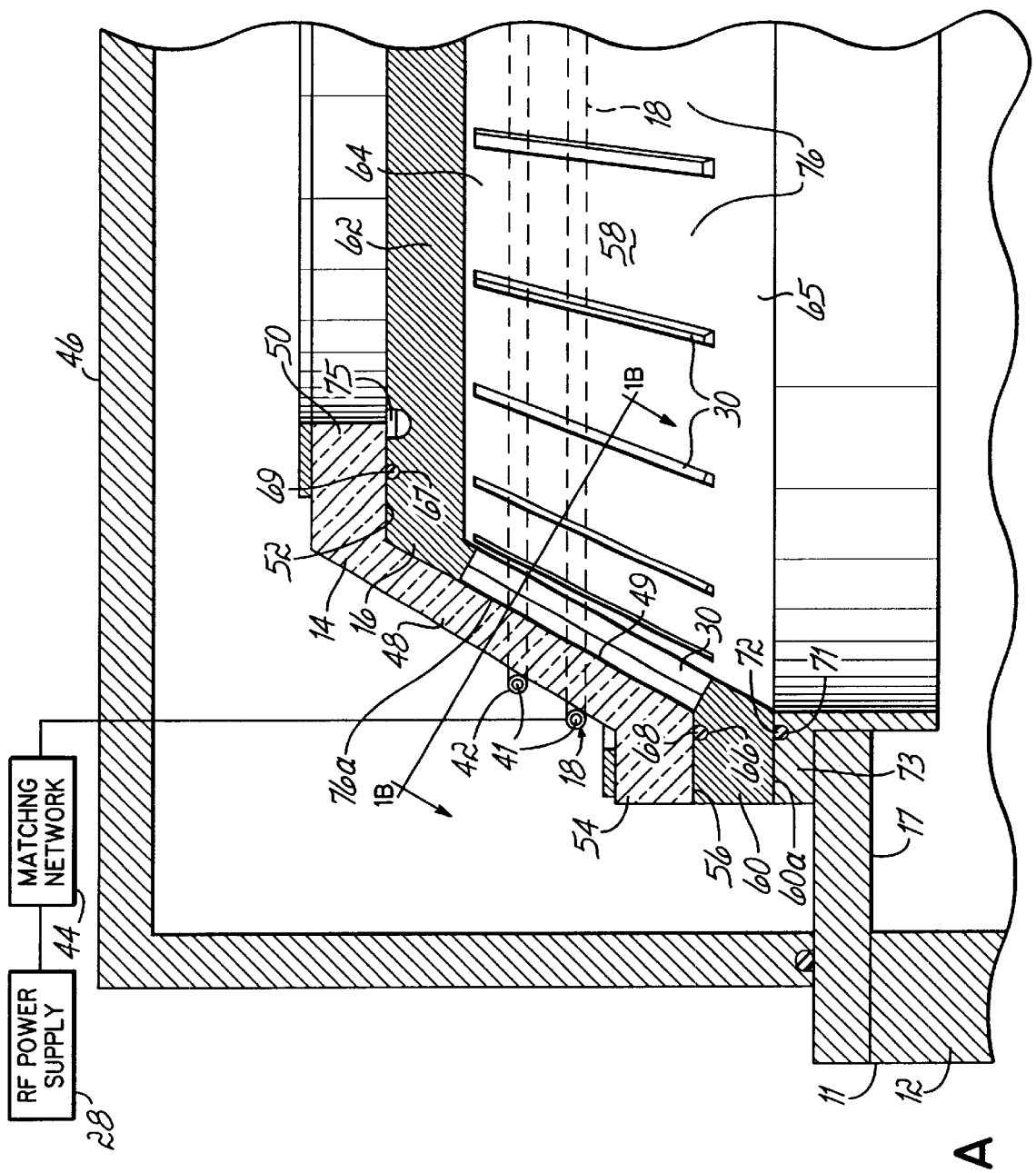
FIG. 1A is an enlarged view of a portion of FIG. 1.

With continued reference to FIGS. 1 and 1A, the chamber wall 12 isolates the vacuum processing space 24 from the surrounding atmosphere and isolates the plasma therein. The chamber wall 12 is formed of a nonmagnetic, electrically-conductive material, such as an aluminum alloy, and has a thickness suitable to resist the compressive force applied to the exterior by atmospheric pressure. The substrate support 20 has a substrate support surface 34 that faces the opening in the ceiling portion 17 of the vacuum chamber 11 and, preferably, that is substantially concentric with the axial centerlines of the dielectric window 14, deposition baffle 16 and antenna 18. The substrate support 20 incorporates a flexible bellows 35 that permits vertical movement of the substrate 32 to adjust the substrate-to-plasma source distance and for transferring substrate 32 to and from a paddle or spatula of a substrate handling system (not shown). The substrate 32 is positioned on the substrate support 20 and is secured thereto by an electrostatic chuck, a vacuum chuck, a mechanical clamp, or a like mechanism. The temperature of the substrate 32 may be regulated by use of an heating device embedded in the substrate support 20 and/or by circulating a heat transfer gas either behind the backside of substrate 32 through, for example, channels or a cavity provided in the substrate support surface 34. The combined use of the heating device and the circulation of the heat transfer gas permit precision temperature control of substrate 32 in narrow temperature ranges.

A hollow, cylindrical shroud 36 extends vertically from a lower support surface 38 of the chamber wall 12 and generally surrounds and is concentric with the substrate support 20. The shroud 36 intercepts etch products sputtered from the substrate 32 to limit the accumulation of a buildup on inner surfaces of the chamber wall 12. Because the shroud 36 can be easily removed and replaced, the buildup does not have to be removed from the chamber wall 12 by a relatively lengthy cleaning during which interior surfaces of the vacuum chamber 11 are exposed to the ambient atmosphere.

An RF substrate-bias supply 40 is electrically connected to the substrate support 20 and is operable for selectively applying a bias potential that accelerates positively charged plasma components toward the substrate 32. The bias potential provided by the RF substrate-bias supply 40 substantially determines the kinetic energies of positive ions attracted to the substrate 32 from the plasma. The RF substrate-bias supply 40 typically operates at a frequency of about 13.56 MHz and at a power between about 100 watts and about 1000 watts. It is understood by those of ordinary skill in the art that the RF substrate-bias supply 40 may be omitted from the plasma processing system 10 and the substrate support 20 may be either grounded or electrically floating.

The vacuum system 22 evacuates gases from the vacuum processing space 24 and maintains a vacuum pressure appropriate for initiating and sustaining a plasma in vacuum processing space 24. Suitable vacuum systems 22 are conventional and include high-vacuum pumps such as a turbomolecular pump. An isolation valve 41 is provided that can be opened and closed as needed to adjust the pumping speed.

After vacuum processing space 24 is evacuated to a base pressure, process gas is supplied by the process gas supply 26 to establish an operating pressure in the range of about 0.1 mTorr to about 10 mTorr, although higher operating pressures in the range of about 10 mTorr to about 250 mTorr are contemplated for chemical-assisted plasma cleaning process. For example, a typical operating pressure is about 60 mTorr for the chemically-assisted plasma cleaning of copper using $H_2$ as the process gas. The process gas supply 26 includes a mass flow controller for selectively providing a suitable flow rate of a process gas to the vacuum processing space 24 via the gas inlet 27. It is understood that gas inlet 27 could be located at a different location in the chamber wall 12, such as above the plane of the support surface 38. Suitable process gases include an inert gas, such as Ar, or a chemically reactive gas such as $H_2$, $Cl_2$, $BCl_3$, $CF_4$, $C_xH_yF_z$ (e.g., $CHF_3$), $CClF_3$ and $SF_6$, or a mixture of one of these chemically reactive gases with $O_2$, $N_2$, He or Ar. The partial pressure of the process gas is preferably the largest contributor to the total pressure represented by the operating pressure.

To establish the operating pressure, the vacuum processing space 24 is evacuated to the base pressure and process gas is supplied at a suitable flow rate through gas inlet 27 while the vacuum processing space 24 is continuously evacuated by the vacuum system 22 at a pumping rate fixed by throttling the gate valve 41. The flow rate is metered, such as by a mass flow controller 39, to provide a typical gas flow rate of about 5 to about 250 standard cubic centimeters per minute (sccm) into the vacuum chamber 11. The pressure within the vacuum processing space is monitored by a suitable vacuum pressure transducer operably cabled to a gauge controller (not shown). By simultaneously evacuating the vacuum processing space 24 using the vacuum system 22 and providing a continuous flow of process gas, volatile and quasi-volatile etch products, cleaned from the exposed surface 31 of substrate 32 by the plasma treatment, are removed from the vacuum chamber 11 and the partial pressure of process gas used to form the plasma is continuously refreshed.

With continued reference to FIGS. 1 and 1A, antenna 18 has the form of a helical or solenoidal coil that surrounds the non-vacuum side of dielectric window 14 and that includes, for example, two (2) coil turns 42 that lie outside of the vacuum chamber 11. Typically, the antenna 18 will have between two (2) and five (5) coil turns wound about the non-vacuum or ambient pressure side of the dielectric window 14. The coil turns of antenna 18 are preferably positioned spaced from the axial extremities of slots 30. The coil turns 42 of antenna 18 preferably closely conform to the exterior of the dielectric window 14 for optimum energy coupling efficiency. However, it is understood that the antenna 18 may have a three-dimensional shape with one or more portions that are non-conformal with the non-vacuum side of the dielectric window 14.

The antenna 18 is preferably constructed of a hollow tubing composed of a material of a low electrical resistivity, such as copper. The antenna 18 has an internal coolant passageway 41 for receiving a flow of a temperature control fluid, such as high-resistivity water. The temperature control fluid absorbs heat from the antenna 18 and transfers warmed coolant fluid to a remote location, such as a recirculating chiller. As a result, the dielectric window 14, the deposition baffle 16, and the antenna 18 are maintained at a stable operating temperature. However, it is appreciated that the antenna 18 and the dielectric window 14 may be cooled by other techniques, such as a directed forced air flow provided by a blower or the like.

The antenna 18 is electrically connected by the RF matching network 44 to, and selectively energized or powered by, the RF power supply 28. The RF power supply 28 outputs a time-varying RF current at a frequency between about 400 kHz and about 13.56 MHz that is supplied to the antenna 18 at a power ranging between about 100 watts and about 5000 watts. The RF matching network 44 optimizes the RF energy transferred from the antenna 18 to the plasma by limiting the RF power reflected back to the RF power supply 28. To limit the reflection, the circuitry of the RF matching network 44 responds to temporal variations in the impedances of RF power supply 28 and antenna 18 and the dynamic electrical load of the plasma to keep the effective impedance of the load remains approximately constant at about 50 ohms. When energized by the RF power supply 28, the antenna 18 radiates isotropic RF electromagnetic fields. A metallic outer enclosure or cage 46 surrounds the antenna 18 to confine the radiated RF electromagnetic fields therein to ensure the safety of nearby persons and to prevent electromagnetic interference with surrounding electronics.

With continued reference to FIGS. 1 and 1A, the dielectric window 14 is mounted in a substantially vacuum-tight fashion with the deposition baffle 16 and includes a frustoconical section 48, an inwardly-extending annular flange 50, and outwardly-extending annular flange 54. The frustoconical section 48 includes an opposite pair of substantially parallel frustoconical surfaces and has a diametrically narrower upper end near annular flange 50 and a diametrically enlarged lower end near the annular flange 54. The frustoconical section 48 of the dielectric window 14 extends upwardly and inwardly between the annular flanges 50, 54 such that an extended conical surface, parallel to either one of its frustoconical surfaces, converges at an apex having a cone angle or an included angle, α, of greater than or equal to 25°, preferably about 60°, as best shown in FIG. 1. The inwardly-extending annular flange 50 encircles an inner circular peripheral edge of the frustoconical section 48 and has a downwardly-facing sealing surface 52. The outwardly-extending annular flange 54 encircles an outer circular periphery of the frustoconical section 48 and has a downwardly-facing sealing surface 56. Preferably, the central axis of the dielectric window 14 is substantially concentric with the axial centerlines of the substrate support 20 and the vacuum chamber 11.

The dielectric window 14 is highly transmissive of RF energy and, to that end, is formed of a non-conductive, dielectric material, such as a ceramic or a polymer. Suitable ceramics for dielectric window 14 include as aluminum oxide, aluminum nitride, silicon nitride, borosilicate glass or quartz and a suitable polymer is a polytetrafluoroethylene (PTFE) or a filled PTFE. The frustoconical section 48 of dielectric window 14 may have a uniform thickness or the thickness may be modulated to tailor the transfer of RF energy through the dielectric window 14 to the vacuum processing space 24. The dielectric window 14 may constitute a single piece of dielectric material or it may be formed in joined portions which are interconnected by a conventional joining techniques.

With continued reference to FIGS. 1 and 1A, the deposition baffle 16 consists of a frustoconical panel 58 that closely conforms to an inner surface 49 of the frustoconical section 48 of the dielectric window 14, an outwardly-extending annular flange 60, and a circular top plate 62. The frustoconical panel 58 is disposed between the frustoconical section 48 of the dielectric window 14 and the vacuum processing space 24 of the vacuum chamber 11. The frustoconical panel 58 extends upwardly and inwardly between the upper and lower peripheral rims 64, 65 of the deposition baffle 16. The frustoconical panel 58 includes a pair of substantially parallel and opposite frustoconical surfaces having a diametrically narrower upper end near the junction with top plate 62 and a diametrically enlarged lower end near flange 60, wherein an extended conical surface, containing at least the outermost frustoconical surface, converges at an apex having an included angle substantially equal to the included angle, α, of the frustoconical section 48 of the dielectric window 14. Preferably, the central axis of the deposition baffle 16 is substantially concentric with the axial centerlines of the dielectric window 14 and the substrate support 20.

Circular grooves 66, 67 are provided in the circular flange 60 and the top plate 62, respectively, and receive therein O-rings 68, 69 that participate in forming a vacuum-tight seal between the deposition baffle 16 and sealing surfaces 52, 56 on the inwardly-extending and outwardly-extending annular flanges 50, 54, respectively, of the dielectric window 14. Provided on the annular flange 60 of deposition baffle 16 is a sealing surface 60a facing a circular groove 71 formed in a cylindrical rim 73 provided on the chamber wall 12 for receiving an O-ring 72, which is compressively captured therebetween to create a vacuum-tight seal between the deposition baffle 16 and chamber wall 12.

The deposition baffle 16 is formed of a material having high electrical and thermal conductivities, such as a metal or a metal alloy. Suitable metals and metal alloys include aluminum or an aluminum alloy, copper or copper alloys, silver-plated copper or copper alloys, or dispersion-strengthened copper. A common dispersion-strengthened copper is formed of aluminum oxide particles dispersed in a copper matrix and is available commercially, for example, from OM Group, Inc. (Cleveland, Ohio), in various grades according to aluminum oxide content generally under the trade name Glidcop™. The frustoconical panel 58, the outwardly-extending annular flange 60, and the top plate 62 may be a single piece of material or may be formed in joined portions.

A circular fluid passageway 75 extends about the outer periphery of the top plate 62. The fluid passageway 75 is adapted for the circulation of a temperature-control fluid to absorb and remove heat transferred from the plasma processing system 10 to the top plate 62. Because the frustoconical panel 58 of deposition baffle 16 and the top plate 62 have good thermal contact for conductive heat transfer, the frustoconical panel 58 does not require additional cooling. However, although not shown in FIG. 1, the frustoconical panel 58 may include, for example, a network of internal passageways (not shown) for circulating a temperature-control fluid for purposes of dissipating heat from the vicinity of the dielectric window 14. Because the deposition baffle 16 is cooled, the transfer of heat energy from baffle 16 to the dielectric window 14 is insignificant and window 14 remains relatively cool.

With continued reference to FIGS. 1 and 1A, the frustoconical panel 58 of the deposition baffle 16 includes a plurality of generally rectangular strips 76. Adjacent pairs of the strips 76 are separated by one of the array of slots 30. The strips 76 are arranged circumferentially about the deposition baffle and are interconnected at their upper edges by the upper peripheral rim 64 and at their lower edges by the lower peripheral rim 65. The slots 30 are defined as spaced-apart gaps between adjacent pairs of the longitudinal strips 76. The slots 30 are spaced angularly about the circumference of the frustoconical panel 58, preferably with substantially equal angular intervals, and are aligned generally parallel to the vertical axis or centerline of the vacuum chamber 11. Each slot 30 terminates internally of each of the upper and lower peripheral rims 64, 65 of the deposition baffle 16, so that the upper and lower peripheral rims 64, 65 define continuous electrically-conductive and thermally-conductive paths about the circumference of the deposition baffle 16.

According to the present invention, the deposition baffle 16 operates as a support member that mechanically supports the dielectric window 14. As a result, the dielectric window 14 can effectively support the force or load due to atmospheric pressure acting on the exterior or non-vacuum surface of the frustoconical section 48 of window 14. More specifically, a window support surface 76a is provided on the outermost portion of each strip 76 of the frustoconical panel 58. Each window support surface 76a is in substantially direct physical contact with a part of the inner surface 49 of the frustoconical section 48. To that end, the axial taper or decrease in diameter of each window support surface 76a is substantially equal to the axial taper or decrease in diameter of the inner surface 49 of the frustoconical section 48, which is consistent with the panel 58 closely conforming to the inner surface 49 of the frustoconical section 48. Collectively, the support surfaces 76a provide significant mechanical support for the frustoconical section 48 of the dielectric window 14. The mechanical support provided by the deposition baffle 16 permits the thickness of the dielectric material forming the dielectric window 14 to be reduced, compared to conventional dielectric windows, because window 14 does not have to be freestanding or otherwise self-supporting. Deposition baffle 16 permits the dielectric window 14 of reduced thickness to withstand the load applied by atmospheric pressure without a significant risk of catastrophic failure Because the thickness of the dielectric window 14 can be reduced, the efficiency is enhanced for the transmission of RF energy from antenna 18 through window 14 to couple with the plasma in the vacuum processing space 24, as compared to the transmission of RF energy through an unsupported conventional dielectric window. By enhancing the transmission efficiency, the RF power supply 28 can be operated at reduced power levels while providing an acceptable RF energy level to the plasma in the vacuum processing space 24.

Due to the support provided by the deposition baffle 16 and the frustoconical shape, the dielectric window 14 is significantly stronger structurally than a flat plate of a similar dielectric material having a similar outer diameter and required to serve as a structural wall. Because of the enhanced strength, a further advantage of the present invention is that the thickness of the material forming the dielectric window 14 can be reduced. Accordingly, the reduced thickness improves the efficiency for transmitting RF energy through the dielectric window 14.

The presence of the deposition baffle 16 between the dielectric window 14 and the vacuum processing space 24 effectively increases the interval between successive cleanings needed to remove the accumulation of buildup from dielectric window 14. Because the buildup is occurring on the metal of the deposition baffle 16 rather than on the dielectric material of the dielectric window 14, the buildup has an improved adhesion and is less prone to flaking and breaking off to form particles. As a result, the accumulating buildup on the deposition baffle 16 is less likely to be a source of particulate matter in the plasma processing system 10 and the buildup can become thicker before cleaning is required.

The slots 30 are needed so that RF energy from antenna 18 can penetrate the deposition baffle 16 and couple with the plasma in the vacuum processing space 24. As is known, the slots 30 promote inductively-coupling of RF energy from antenna 18 with the plasma while suppressing capacitive coupling of RF energy with the plasma. The slots 30 are preferably configured to prevent the buildup of sputter residue on the dielectric window 14. For example, the slots 30 prevent the accumulation of a conductive buildup arising from conductive materials, such as metals, sputtered from the substrate 32 during processing. If not interrupted in some fashion, the conductive buildup could interconnect adjacent strips 76 of the frustoconical panel 58 and provide a continuous conductive path about the circumference of the deposition baffle 16. Because the continuous conductive path is between the antenna 18 and the dielectric window 14, its presence would affect the operation of the plasma processing system 10 by generating electrical currents circulating that reduce the effectiveness of the coupling of RF energy from the antenna 18 to the plasma. Non-metallic buildup and thick metallic layers that are highly resistive can still inhibit plasma ignition and decrease the efficiency of RF power transmission through the dielectric window 14. Thus, the elimination or prevention of buildup on the dielectric window 14 by the slots 30 promotes the efficient transfer of RF energy to the plasma.

Figure 1B:
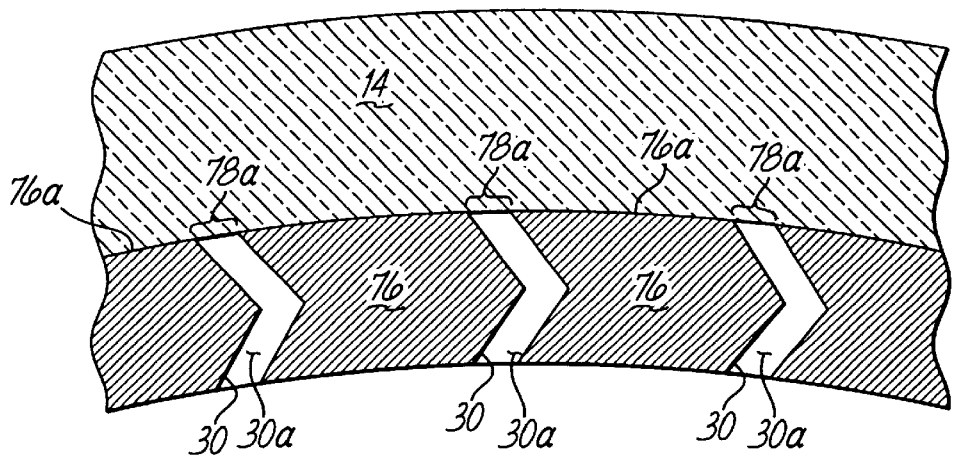
FIG. 1B is a cross-sectional view taken generally along line 1B—1B of FIG. 1A.

In a preferred embodiment and as illustrated in FIG. 1B, each slot 30 presents a tortuous pathway 30a, such as the illustrated chevron shape, so that line-of-sight paths are eliminated in a radially-outward direction from the vacuum processing space 24 to the dielectric window 14. In particular, the tortuous pathways 30a eliminate line-of-sight travel paths from the substrate 32 to the dielectric window 14 so that material sputtered from the exposed surface 31 of substrate 32 cannot strike and deposit as a buildup on the dielectric window 14. Each tortuous pathway 30a has two or more radially-extending segments that are angularly offset for creating the tortuous pathway that eliminates the line-of-sight travel paths. Each tortuous pathway 30a eliminates, or significantly reduces the rate of, buildup of sputtered material from the substrate 32 in a protected zone 78a on the dielectric window 14. Slots having a chevron-shape are illustrated in U.S. Pat. No. 6,197,165 (Drewery et al.). The disclosure of the Drewery et al. patent is hereby incorporated by reference herein in its entirety. Slots with tortuous pathways may also be created by providing a parallel array of gun-drilled holes in the frustoconical panel 58. Slots having gun-drilled no-line-of-sight paths are illustrated in U.S. patent application Ser. No. 09/650,532, entitled "Process, Apparatus and Method for Improving Plasma Distribution And Performance in an Inductively Coupled Plasma Using an Internal Inductive Element," filed on Aug. 30, 2000 and commonly assigned to the assignee of the present application. The disclosure of this patent application is hereby incorporated by reference herein in its entirety.

Figure 1C:
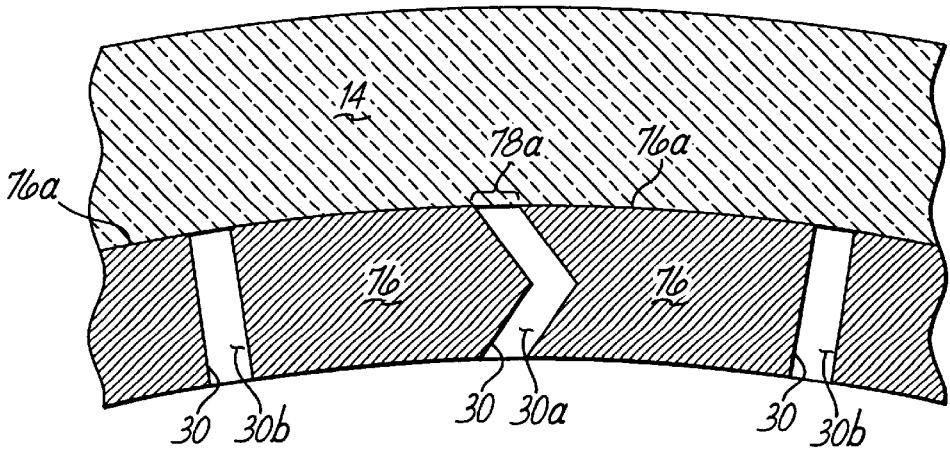
FIG. 1C is a cross-sectional view, similar to FIG. 1B, of an alternative embodiment of a deposition baffle in accordance with the principles of the present invention.

In another embodiment of the deposition baffle 16 of the present invention and as illustrated in FIG. 1C, at least one of the slots 30 is configured with a tortuous pathway 30a, such as the illustrated chevron pathway discussed above with regard to FIG. 1B. The remaining slots 30 are configured as line-of-sight pathways 30b bounded by substantially parallel edges of adjacent pairs of strips 76. The tortuous pathway 30a provides a protected zone 78a on the dielectric window 14 which is concealed or shadowed from material sputtered from the exposed surface 31 of the substrate 32. As a result, the protected zone 78a on the dielectric window 14 remains substantially free of build-up or, at the least, buildup accumulates at a reduced rate in zone 78a. The use of protected zones, similar to protected zone 78a, in a plasma processing system susceptible to the accumulation of conductive sputtered buildup on a dielectric window is disclosed in U.S. Pat. No. 5,569,363 (Bayer et al.). The disclosure of the Bayer patent is hereby incorporated by reference herein in its entirety.

Figure 1D:
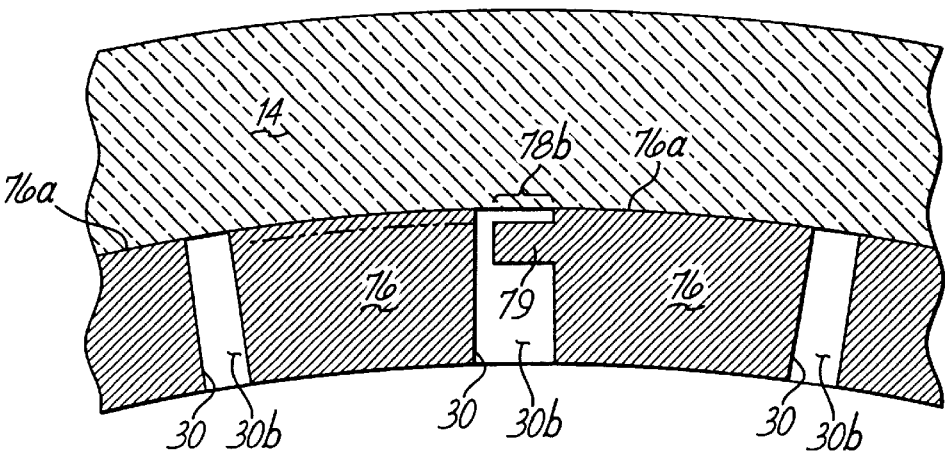
FIG. 1D is a cross-sectional view, similar to FIG. 1B, of an alternative embodiment of a deposition baffle in accordance with the principles of the present invention.

In another embodiment of the deposition baffle 16 of the present invention and as illustrated in FIG. 1D, at least one of the slots 30 has a line-of-sight pathway 30b that is partially obstructed in a radial direction by a lip 79 and the remaining slots have line-of-sight pathways 30b that are not obstructed from the travel paths of material sputtered from the exposed surface 31 of substrate 23. The lip 79 extends along the length of the slot and prevents buildup from accumulating on a protected zone 78b of the dielectric window 14. The lip 79 is attached to one of the strips 76 and has an edge that is spaced circumferentially from the adjacent strip 76. The radially-outermost portion of lip 79 is also spaced apart radially from the dielectric window 14. Alternatively, one of the strips 76 can be spaced apart radially from the dielectric window 14, as shown by the dashed line in FIG. 1D, so that the spaced-apart one of the strips 76 provides a protected zone, similar to protected zone 78b, on window 14.

Figure 2A:
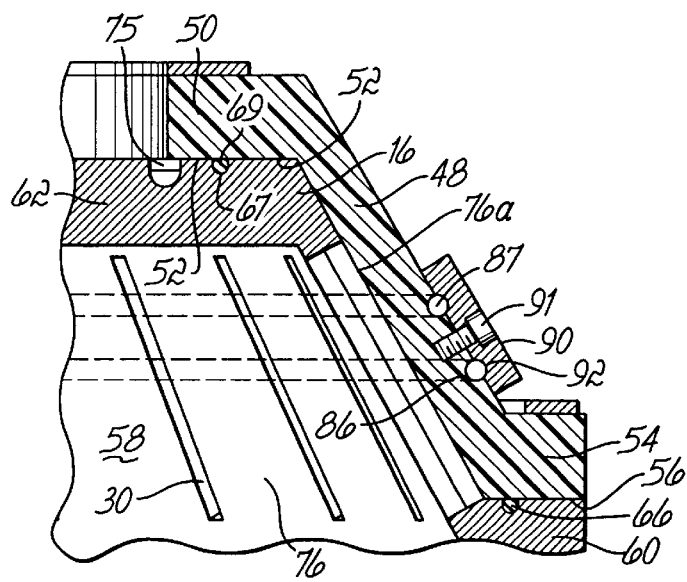
FIG. 2A is an enlarged view of a portion of FIG. 2.

With reference to FIGS. 2 and 2A, in certain embodiments of the present invention, a dielectric window 85 may be formed of a polymer or, more specifically, a polytetrafluoroethylene (PTFE), such as Teflon® commercially available from E.I. du Pont de Nemours and Company (Wilmington, Del.) or other similar PTFE products. The polymer forming the dielectric window 85 may be a neat polymer or, in the alternative, may be a composite that incorporates a filler into the a polymer matrix, such as a filled polytetrafluoroethylene. Suitable fillers include fibers or powders of mica, glass, carbon, graphite, and other like materials. The presence of the filler in the polymer matrix is known to improve the mechanical strength and thermal stability of the composite. Polytetrafluoroethylene also has a high chemical resistance so that chemical attack by the process gas is not a significant concern.

Polytetrafluoroethylene, being a plastic material, is significantly less susceptible to catastrophic failure than brittle dielectric materials such as aluminum oxide, aluminum nitride, silicon nitride, borosilicate glass or quartz. However, PTFE is a soft material that is easily deformed at temperatures above about 180° C., and melts at about 327° C. As a result, the deposition baffle 16 must be cooled to regulate the temperature of the dielectric window 85. To that end, deposition baffle 16 is cooled by the circulation of a temperature control liquid in fluid passageway 75. The flow rate of the temperature control liquid is sufficient to keep the temperature of the PTFE below about 180° C. However, the incorporation of a filler in the PTFE forming dielectric window 85 significantly improves the mechanical stability for temperatures exceeding about 180° C. and less than the melting point.

Dielectric window 85 receives significant mechanical support from the strips 76a of the frustoconical panel 58. Because the dielectric window 85 is not freestanding or self-supporting, the thickness of the PTFE forming the dielectric window 85 can be reduced. As a result, RF energy can pass through the dielectric window 85 with a significantly reduced attenuation. Because the transmission efficiency of dielectric window 85 is enhanced, the RF power supply 28 can be operated at reduced power levels while providing an acceptable RF power to sustain the plasma in the vacuum processing space 24.

Provided in a non-vacuum surface of the dielectric window 85 is a helical groove 86 (FIG. 2A) which provides a recess for receiving a plurality of, for example, three, coil turns 87 of an antenna 88. A frustoconical outer cover 90 is attached to the non-vacuum surface of the dielectric window 85 by a plurality of plastic screws 91. An inwardly-facing surface of the outer cover 90 includes a helical groove 92 (FIG. 2A) for receiving a portion of the antenna 88 and completing the encapsulation of antenna 88 within a two-piece enclosure. The outer cover 90 is preferably formed of a polymer or, more specifically, formed of a PTFE or a filled PFTE.

Figure 3:
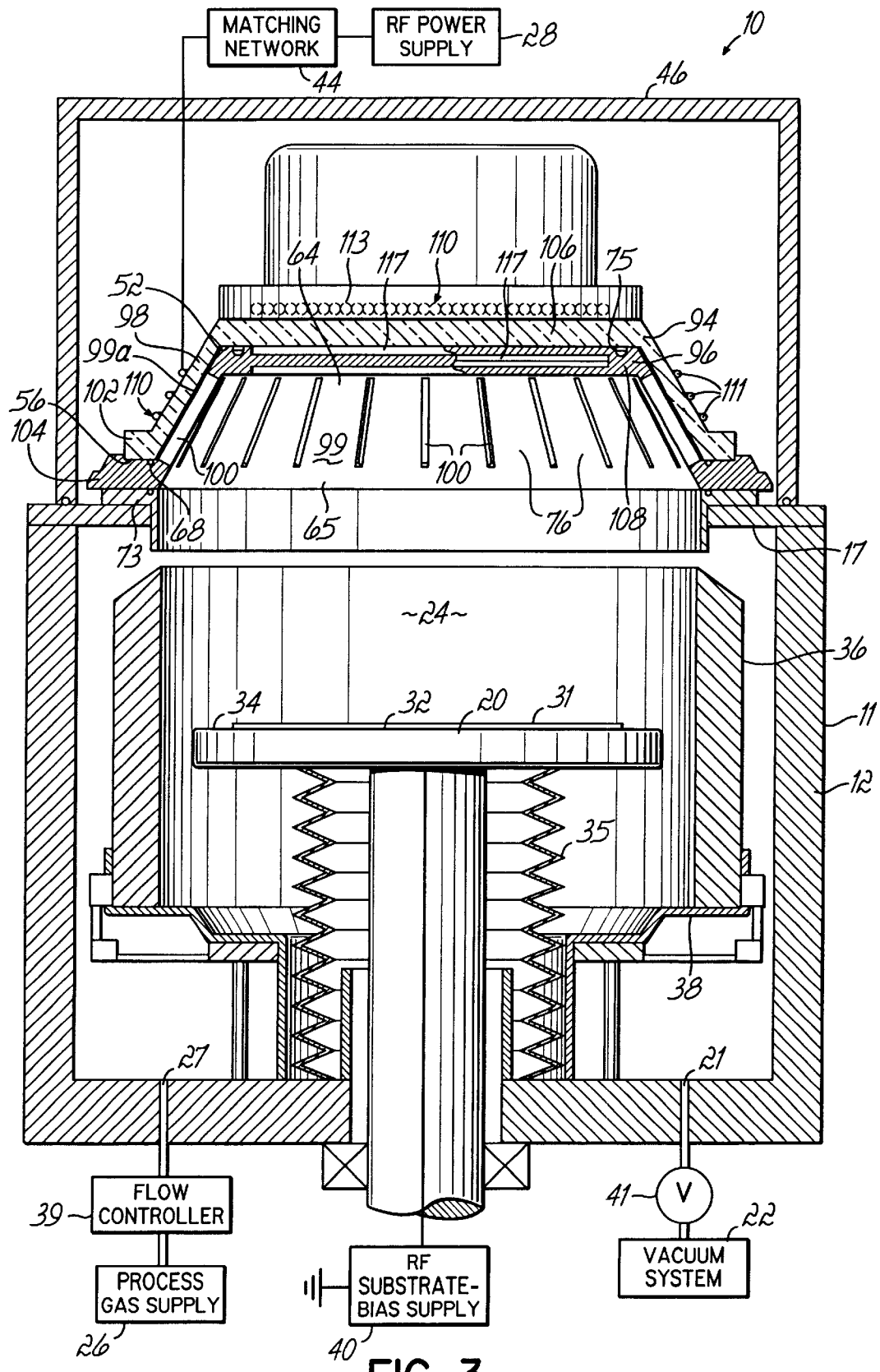
FIG. 3 is a partial side cross-sectional view, similar to FIG. 1, of another alternative embodiment of the present invention.

With reference to FIG. 3, a dielectric window 94 and a deposition baffle 96 are illustrated in accordance with an alternative embodiment of the present invention. Similar to the arrangement of dielectric window 14 and deposition baffle 16 (FIG. 1), a frustoconical section 98 of the dielectric window 94 overlies a frustoconical panel 99 of the deposition baffle 96, wherein the frustoconical panel 99 includes a plurality of slots 100. The frustoconical panel 99 includes a plurality of strips 99a provides mechanical support for the frustoconical section 98 of the dielectric window 94. The dielectric window 94 also includes a lower annular flange 102 that engages a lower annular flange 104 of the deposition baffle 96 and an upper disk-shaped portion 106 that covers a disk-shaped top plate 108 of the deposition baffle 96. The disk-shaped top plate 108 of the deposition baffle 96 provides mechanical support for the upper disk-shaped portion 106 of the dielectric window 94.

The dielectric window 94 is illustrated in FIG. 3 as substantially planar, although not so limited, and formed of an RF-transmissive material, such as a dielectric. Suitable dielectric materials include aluminum oxide, aluminum nitride, silicon nitride, borosilicate glass or quartz, and polymers, such as PTFE or filled PTFE. Although the dielectric window 94 is illustrated in FIG. 3 as being formed of a single piece of material, the present invention is not so limited and the frustoconical section 98 and the upper disk-shaped portion 106 could comprise plural components joined in a vacuum-tight fashion.

An antenna 110, similar to antenna 18 (FIG. 1), includes helically-wound coil turns 111 surrounding and proximate to the frustoconical section 98 of the dielectric window 94 and an array of coil turns 113 that overlie the upper disk-shaped portion 106 of the dielectric window 94. Coils turns 111, 113 are preferably interconnected for electrical continuity and are collectively electrically connected to the RF power supply 28. Coil turns 111, 113 are operable for radiating RF energy through the frustoconical section 98 and the upper disk-shaped portion 106, respectively, into the vacuum processing space 24. A parallel rectangular array of linear slots 117, illustrated as no-line-of-sight chevron slots in FIG. 3 but not so limited, extend through the top plate 108 beneath the coil turns 113. As discussed above with regard to slots 30 (FIG. 1), slots 117 restrict the accumulation of a buildup due to sputtered etch products on the vacuum-side surfaces of the dielectric window 94 while allowing transmission of RF energy therethrough to couple with the plasma.

An advantage of the dielectric window 94 and the deposition baffle 96 is that the mechanical support of the frustoconical section 98 by the frustoconical panel 99 of the baffle 96 permits the thickness of the upper disk-shaped portion 106 of window 94 to be reduced while retaining a large footprint or effective area for the antenna 110. The mechanical support promotes efficient transfer of RF power to the vacuum processing space 24 because the effective area of antenna 110 can be increased while concurrently minimizing the thickness of the disk-shaped portion 106 of dielectric window 94 required to withstand the load applied by atmospheric pressure thereupon.

Figure 4A:
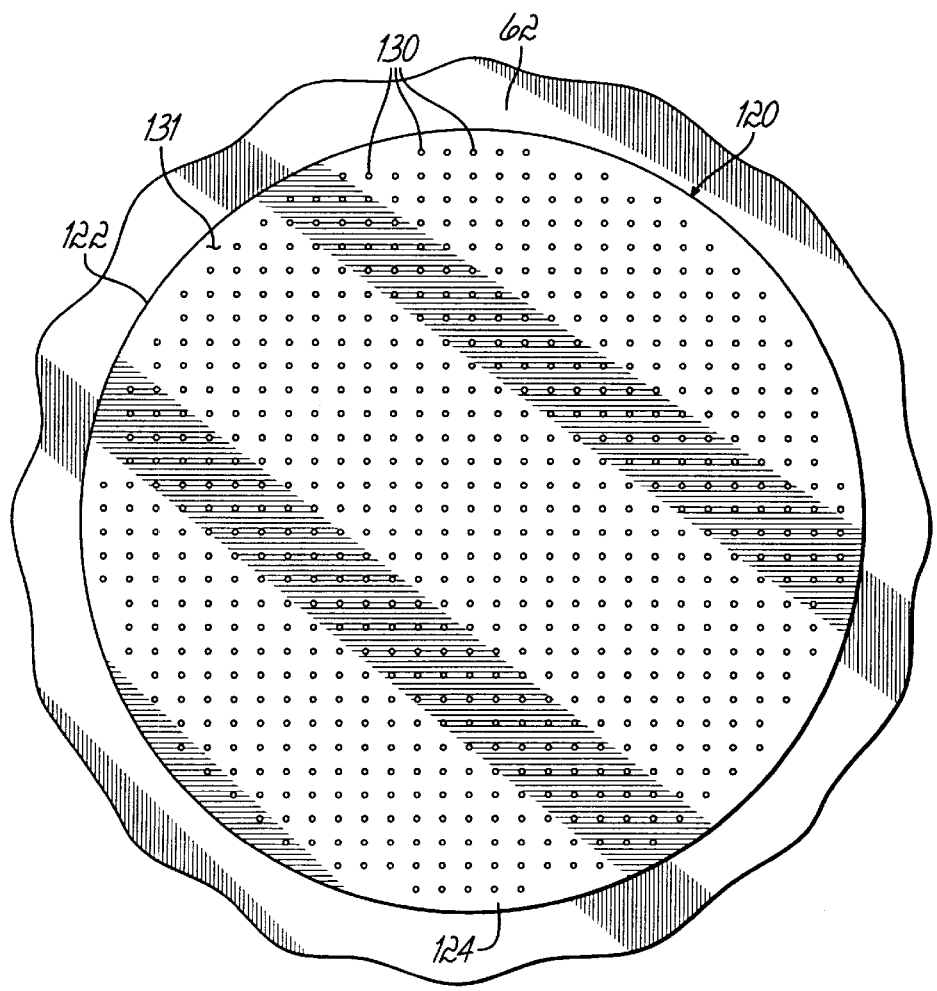
FIG. 4A is a perspective view of a portion of FIG. 4.
Figure 4:
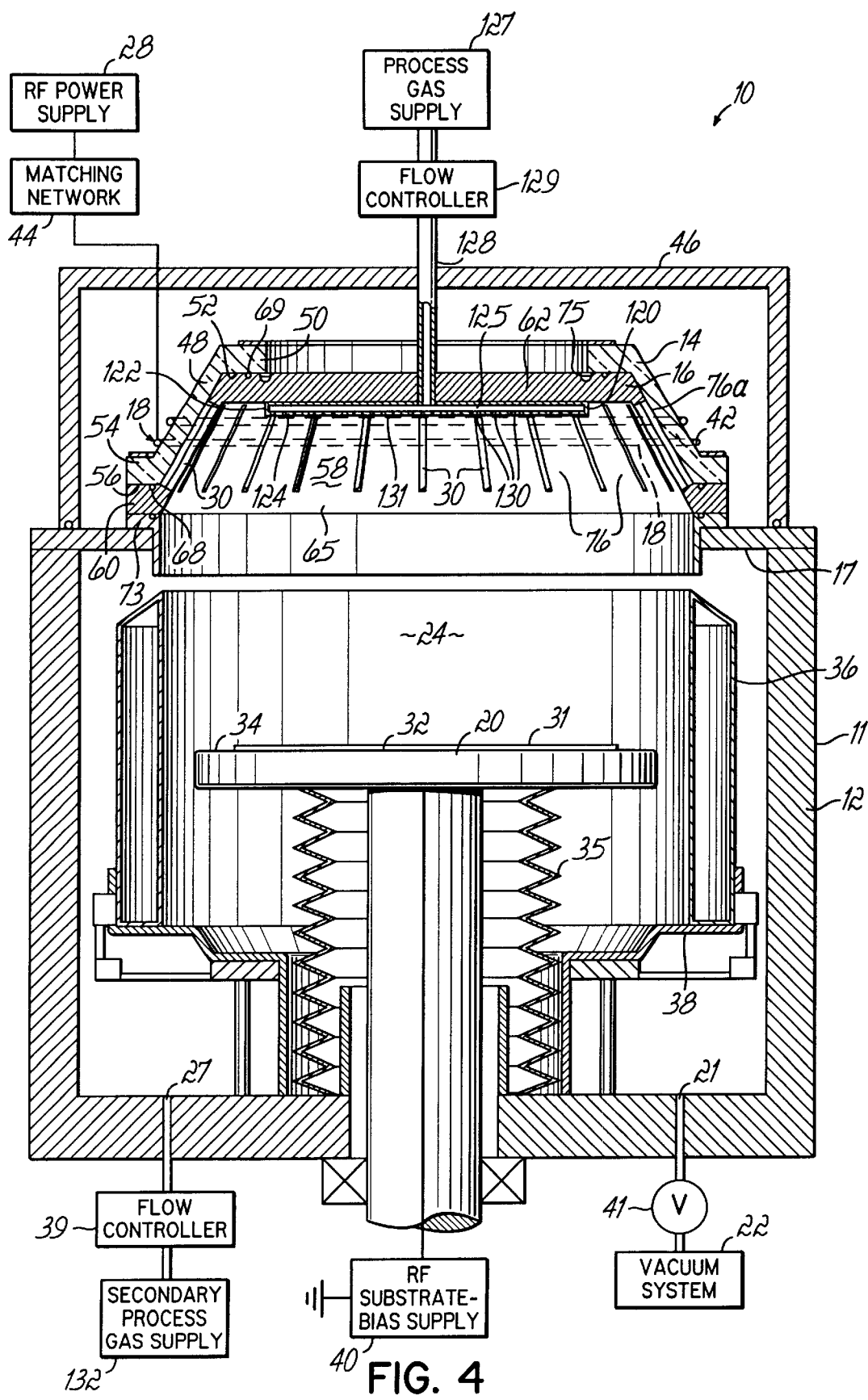
FIG. 4 is a partial side cross-sectional view, similar to FIG. 1, of another alternative embodiment of the present invention.

With reference to FIGS. 4 and 4A and using like reference numerals for like features in FIGS. 1 and 1A, in an alternative embodiment of the present invention, a circular gas distribution plate 120 is attached beneath the top plate 62 and is suspended above the substrate support 20. The gas distribution plate 120 has a cylindrical side wall 122 and a circular end plate 124 that collectively define a generally cylindrical gas plenum 125. The end plate 124 lies generally in a plane above and substantially parallel to the exposed surface 31 of substrate 32 and has a substantially facing relationship therewith. The gas plenum 125 receives a flow of process gas selectively supplied by a process gas supply 127 through a gas inlet 128 in the chamber wall 12 and controlled by an electronic mass flow controller 129. It is desirable that the gas distribution plate 120 be formed of a material, such as aluminum or an aluminum alloy, that resists attack or corrosion by chemically-aggressive process gases. The gas distribution plate 120 can be integral with the top plate 62 or, in the alternative, can be a separate piece attached in a sealed fashion to the top plate 62.

A plurality of gas ports 130, such as circular openings of a specified diameter, extend through a lower surface 131 of the end plate 124. The gas ports 130 deliver a spatially distributed flow of process gas to the vacuum processing space 24 of vacuum chamber 11. As best shown in FIG. 4A, the gas ports 130 are arranged in an array and, preferably, are arranged in an ordered array which is substantially symmetrical about the centerline of the deposition baffle 16. Depending upon the process requirements, however, the arrangement of the gas ports 130 can be arranged in an asymmetrical array or randomly to provide a non-uniform flow of process gas into the vacuum processing space 24. Each of the gas ports 130 may include a nozzle (not shown) or a similar structure for directing the flow of process gas or for modifying the gas flow rate or outlet pressure.

The gas distribution plate 120 may be used in combination with the gas inlet 27 for providing one process gas or, alternatively, can provide a secondary process gas or can be the sole gas source. As an example of combined usage in plasma cleaning, a noble or inert gas, such as Ar, may be provided from a secondary process gas supply 132 through the gas inlet 27 (FIG. 4) and a chemically-reactive process gas, such as $H_2$, may be provided by the gas distribution plate 120. Of course, the inert and chemically-active process gases could be mixed and provided solely by one of either the gas distribution plate 120 or the gas inlet 27. The presence of the inert gas, for example, in the gas mixture is believed to ease the ignition of the inductively-coupled plasma.

The gas distribution plate 120 improves the spatial uniformity of the dispersion of the process gas provided to the vacuum processing space 24 by spatially distributing the inflow of process gas via the spaced plurality of gas ports 130. This is particularly important for plasma cleaning in which the operating pressure is elevated and, as a result, the uniformity of the dispersion of the chemically-reactive process gas becomes a significant concern. The uniformity of the surface cleaning or etching of the exposed surface 31 of substrate 32 is sensitive to the symmetry in spatial distribution of the gas ports 130, the number of gas ports 130, the height the openings 130 are disposed above the substrate 32, and the lateral or peripheral position of the gas ports 130 relative to the substrate support 20, all of which can be varied without departing from the spirit and scope of the present invention for optimizing the distribution of the plasma density and the plasma treatment of the exposed surface 31 of substrate 32.

Figure 5:
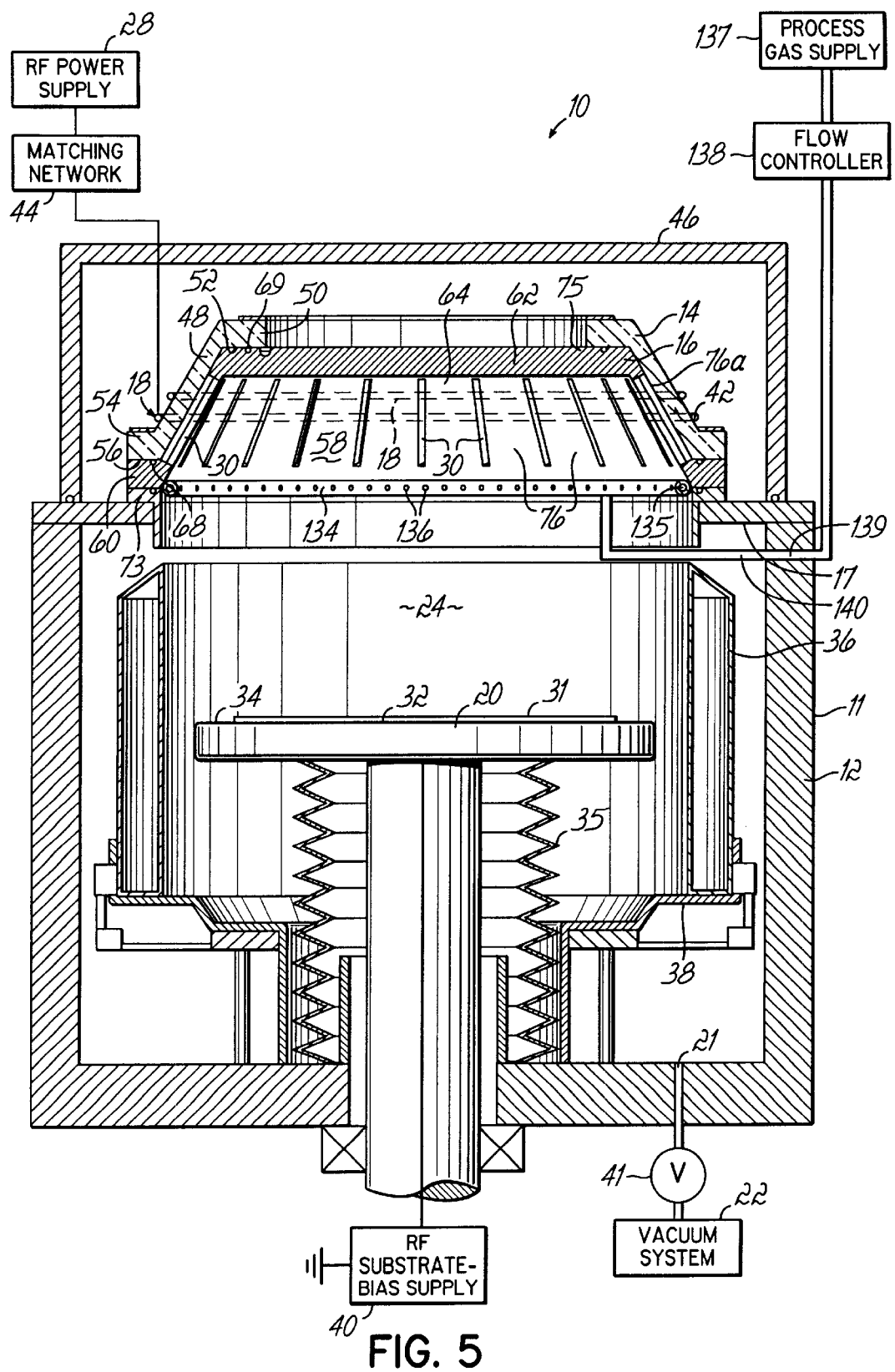
FIG. 5 is a partial side cross-sectional view, similar to FIG. 1, of another alternative embodiment of the present invention.

With reference to FIG. 5 and using like reference numerals for like features in FIGS. 1 and 1A, in an alternative embodiment of the present invention, a gas distribution ring 134 is attached to the deposition baffle 16 and positioned within the vacuum chamber 11. The gas distribution ring 134 generally overlies the periphery of the substrate support surface 34 of the substrate holder 20 and is contained in a plane that is substantially parallel with a plane containing the substrate support surface 34. Gas distribution ring 134 is an annular hollow ring that defines a gas plenum 135 having plural gas ports 136, such as circular openings of a specified diameter, that are oriented substantially radially inward towards the centerline of the deposition baffle 16. The gas distribution ring 134 receives a flow of a process gas from a process gas supply 137 through a gas inlet 139 and a length of tubing 140, as metered by an electronic mass flow controller 138. The gas distribution ring 134 preferably provides a radial gas flow substantially symmetrical about the centerline of the ring 134 and substantially parallel to the support surface 38. Alternatively, the gas ports 136 can be directed axially to point perpendicular to the plane of the support surface 38, or can be oriented at an angle between the perpendicular and radial directions. The gas distribution ring 134 is preferably formed of a material, such as aluminum or an aluminum alloy, that is resistant to attack or corrosion by chemically-aggressive process gases. The process gas distribution ring 134 may be used in tandem with the gas distribution plate 120 for directing a uniform flow of process gas downward and radially inward toward the exposed surface 31 of the substrate 32 for improving the plasma uniformity and the uniformity of gas flow over the exposed surface 31.

The gas distribution ring 134 improves the spatial uniformity of the process gas provided to the vacuum processing space 24 by distributing the gas ports 136 about the periphery of the vacuum chamber 11, as opposed to having a single gas inlet such as gas inlet 27. The gas distribution ring 134 provides substantially similar benefits as to plasma uniformity and process gas flow as discussed above with regard to the gas distribution plate 120 (FIG. 4) and can be utilized either with or without gas inlet 27 (FIG. 4) and a secondary process gas supply 132 (FIG. 4), also as discussed above. In a combined configuration, a single process gas supply, such as process gas supply 137, may supply process gas to both of the gas distribution ring 134 and the gas inlet 27. Alternatively, a secondary gas from a secondary process gas supply 132 could be provided through an inlet, such as inlet 27 (FIG. 4).

Figure 6:
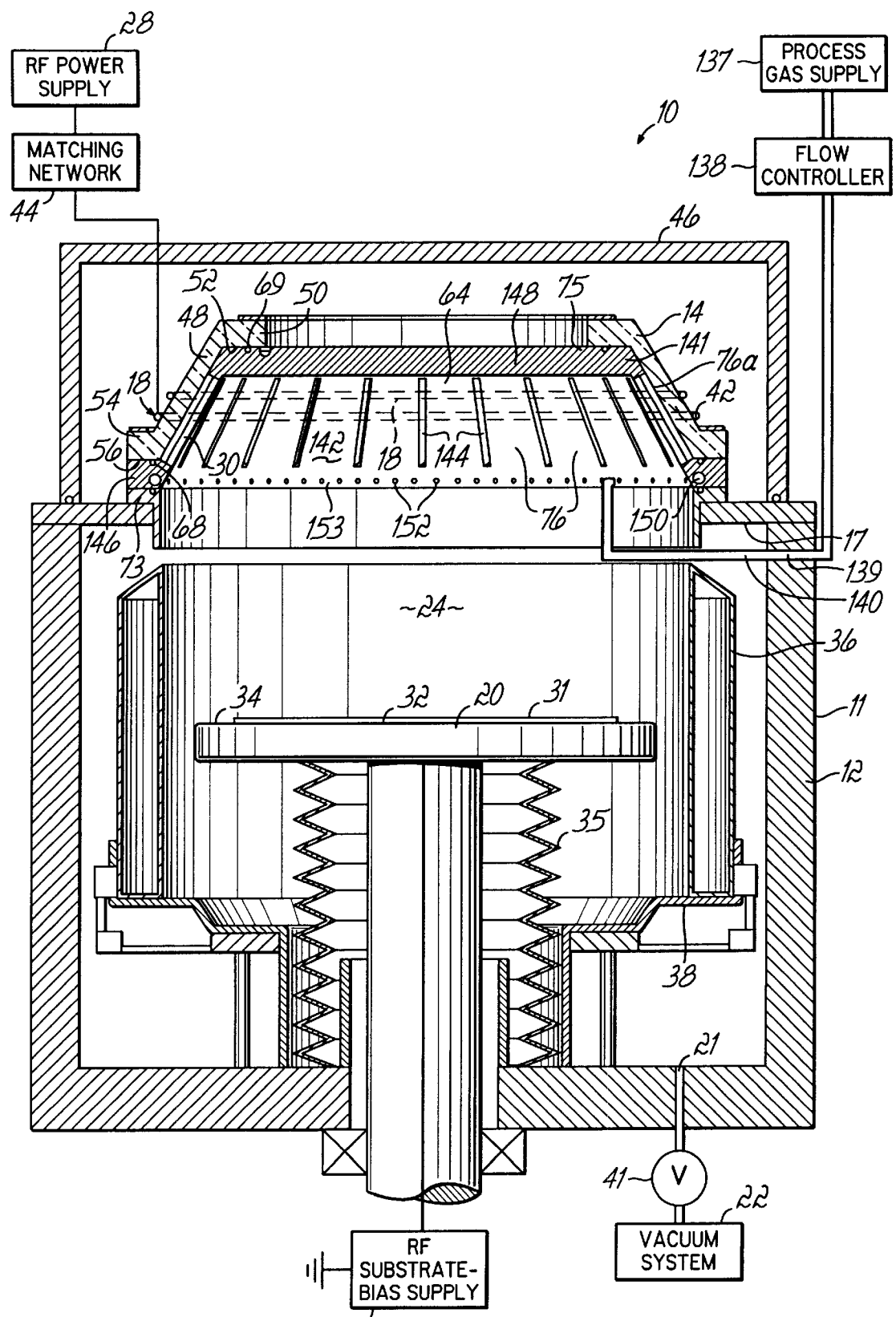
FIG. 6 is a partial side cross-sectional view, similar to FIG. 1, of another alternative embodiment of the present invention.

Using like reference numerals for like features in FIGS. 1, 1A and 5, a deposition baffle 141, similar to deposition baffle 16 (FIG. 1), is illustrated in FIG. 6. The deposition baffle 141 includes a frustoconical panel 142 having a plurality of slots 144, an annular flange 146 sealed in a vacuum-tight fashion to the cylindrical rim 73 of the chamber wall 11, and a disk-shaped top plate 148. Extending about the circumference of the frustoconical panel 142 is an embedded gas passageway 150. The gas passageway 150 is in fluid communication with a plurality of gas ports 152, which extend through a radially inwardly-facing face 153 of the frustoconical panel 142. The gas ports 152 are preferably arranged with substantially equal angular spacings about the circumference of the deposition baffle 141 so that the flow of process gas is substantially radially uniform, but the present invention is not so limited. Depending upon the process requirements, the arrangement of the gas ports 152 can be arranged to provide a non-uniform flow of process gas into the vacuum processing space 24. Although not shown, additional gas passageways, similar to gas passageway 150, could be provided in other circumferentially-continuous portions of the deposition baffle 141. Alternatively, additional gas passageways (not shown) could be provided within the frustoconical panel 142 that are generally aligned parallel to the slots 144 and could be supplied with process gas by a circumferential gas passageway, similar to gas passageway 150, or by an external gas distribution manifold (not shown).

The gas passageway 150 and gas ports 152 improve the spatial uniformity of the process gas provided to the vacuum processing space 24 by distributing the gas ports openings about the periphery of the vacuum chamber 11, rather than the restricted gas flow imposed by having a single gas inlet, such as gas inlet 27. The gas passageway 150 and gas ports 152 have substantially similar benefits as those discussed above with respect to the gas distribution plate 120 (FIG. 4) and gas distribution ring 134 (FIG. 5) and can be utilized either with or without gas inlet 27 (FIG. 1). The gas passageway 150 and gas ports 152 could also be utilized for introducing a flow of a secondary process gas into the vacuum processing space 24, wherein the secondary process gas would be provided by a secondary process gas supply, similar to secondary process gas supply 132 (FIG. 4).

What is claimed is:

1. A plasma processing system for treating a substrate with a plasma, the system comprising:
    a vacuum chamber having a chamber wall which surrounds a vacuum processing space and an opening in the chamber wall;
    a gas inlet in the chamber wall for introducing a process gas into the vacuum processing space;
    a substrate support positioned within the vacuum processing space, said substrate support adapted to receive and support the substrate;
    a radiofrequency (RF) power supply;
    a support member positioned in the opening of the chamber wall, said support member having a frustoconical panel with a plurality of slots configured to allow RF energy to enter the vacuum processing space, adjacent pairs of said plurality of slots separated by one of a plurality of strips;
    an RF-transmissive dielectric window positioned adjacent to said support member, said dielectric window having a frustoconical section mechanically supported by the plurality of strips of the frustoconical panel; and
    an antenna positioned adjacent to the frustoconical section of said dielectric window, said dielectric window disposed between said antenna and said support member, said antenna electrically connected to said RF power supply and operable to provide RF energy for transmission through said dielectric window and said plurality of plots to the vacuum processing space for forming the plasma from the process gas.

2. The plasma processing system of claim 1, wherein said dielectric window is formed from an RF-transmissive material selected from the group consisting of aluminum oxide, aluminum nitride, silicon nitride, borosilicate glass, quartz and combinations thereof.

3. The plasma processing system of claim 1, wherein said support member includes a circular top plate having an outer peripheral rim joined to the plurality of strips of the frustoconical panel.

4. The plasma processing system of claim 3, wherein the top plate includes a flow passageway configured for the circulation of a temperature control fluid, the temperature control fluid absorbing and transporting heat from the top plate when said antenna is energized.

5. The plasma processing system of claim 3, wherein said antenna further comprises a plurality of coil turns positioned adjacent to the top plate, said dielectric window further comprises a disk-shaped portion positioned adjacent to the top plate, the disk-shaped portion mechanically supported by the top plate, and the top plate further includes a plurality of slots configured to allow RF energy to enter the vacuum processing space.

6. The plasma processing system of claim 5, wherein adjacent pairs of the plurality of slots are oriented substantially parallel to each other so that RF energy is efficiently transmitted from the plurality of coil turns through the slots to the vacuum processing space.

7. The plasma processing system of claim 1, wherein the frustoconical panel of said support member has a first included angle of between 25° and 180° and the frustoconical section of said dielectric window has a second included angle substantially equal to the first included angle.

8. The plasma processing system of claim 7, wherein the first included angle is about 60°.

9. The plasma processing system of claim 1, wherein adjacent pairs of the plurality of slots are oriented substantially parallel to each other so that RF energy is transmitted from said antenna to the vacuum processing space.

10. The plasma processing system of claim 1, wherein the plurality of slots are configured to allow RF energy to enter the vacuum processing space and to shield said dielectric window from the arrival of material sputtered from the substrate.

11. The plasma processing system of claim 10, wherein said antenna comprises a plurality of coil turns helically surrounding the frustoconical section of said dielectric window and adjacent pairs of the plurality of slots are oriented substantially parallel to each other so that RF energy is transmitted from the plurality of coil turns to the vacuum processing space.

12. The plasma processing system of claim 1, wherein at least a portion of said antenna is embedded in said dielectric window.

13. The plasma processing system of claim 12, wherein said dielectric window further comprises a helical groove formed in a surface thereof, at least a portion of said antenna being positioned in the helical groove.

14. The plasma processing system of claim 12, further comprising an outer cover having a helical groove formed in a surface thereof, at least a portion of said antenna being positioned in the helical groove.

15. The plasma processing system of claim 1, further comprising an outer cover having a helical groove formed in a surface thereof, at least a portion of said antenna being embedded in the outer cover by being positioned in the helical groove.

16. The plasma processing system of claim 1, further comprising a second gas inlet in said chamber wall for providing a flow of a second process gas and a gas source positioned above said substrate support and in fluid communication with said gas inlet, said gas source supplying a flow of the second process gas at multiple locations into the vacuum processing space, wherein the first process gas and the second process gas are energized by the RF energy to form the plasma.

17. The plasma processing system of claim 1, wherein said support member is formed from an electrically-conductive material.

18. A plasma source for a plasma processing system used to treat a substrate with a plasma, the plasma processing system including a vacuum chamber with a chamber wall defining a vacuum processing space and an opening in the chamber wall, and an antenna operable to radiate RF energy, comprising:

a support member capable of being positioned in an opening in a vacuum chamber, said support member having a frustoconical panel with a plurality of slots configured to allow RF energy to enter a vacuum processing space, adjacent pairs of said slots separated by one of a plurality of strips; and an RF-transmissive dielectric window capable of being positioned between the antenna and said support member, said dielectric window having a frustoconical section mechanically supported by the plurality of strips of the frustoconical panel when disposed adjacent to the support member, said dielectric window and said support member transferring RF energy from an antenna to a vacuum processing space, when mounted to the vacuum chamber, for forming a plasma from a process gas in the vacuum processing space.

19. The plasma source of claim 18, wherein said support member is formed from an electrically-conductive material.

20. The plasma source of claim 18, wherein said dielectric window is formed from an RF-transmissive material selected from the group consisting of aluminum oxide, aluminum nitride, silicon nitride, borosilicate glass, quartz and combinations thereof.

21. The plasma source of claim 18, wherein adjacent pairs of the plurality of slots are oriented substantially parallel to each other so that RF energy is transmitted from said antenna to the vacuum processing space.

22. A plasma processing system for treating a substrate with a plasma, the system comprising:

a vacuum chamber having a chamber wall which surrounds a vacuum processing space and an opening in the chamber wall;

a gas inlet in the chamber wall for introducing a process gas into the vacuum processing space;

a substrate support positioned within the vacuum processing space, said substrate support adapted to receive and support the substrate;

a radiofrequency (RF) power supply;

a support member positioned in the opening of the chamber wall, said support member having a frustoconical panel and a top plate joined to the frustoconical panel, the frustoconical panel and the top plate including a plurality of slots configured to allow RF energy to enter the vacuum processing space;

an RF-transmissive dielectric window positioned adjacent to said support member, said dielectric window having a frustoconical section mechanically supported by the frustoconical panel of said support member and a disk-shaped portion mechanically supported by the top plate; and an antenna positioned adjacent to the frustoconical section of said dielectric window and including a plurality of coil turns positioned adjacent to the top plate, said dielectric window disposed between said antenna and said support member, said antenna electrically connected to said RF power supply and operable to provide RF energy for transmission through said dielectric window and said support member to the vacuum processing space for forming the plasma from the process gas.

23. The plasma processing system of claim 22, said support member is formed from an electrically-conductive material.

24. The plasma processing system of claim 22, wherein said dielectric window is formed from an RF-transmissive material selected from the group consisting of aluminum oxide, aluminum nitride, silicon nitride, borosilicate glass, quartz and combinations thereof.

25. The plasma processing system of claim 22, wherein adjacent pairs of the plurality of slots are oriented substantially parallel to each other so that RF energy is transmitted from said antenna to the vacuum processing space.

26. A plasma source for a plasma processing system used to treat a substrate with a plasma, the plasma processing system including a vacuum chamber with a chamber wall defining a vacuum processing space and an opening in the chamber wall, and an antenna operable to radiate RF energy, comprising:

a support member positioned in the opening of the chamber wall, said support member having a frustoconical panel and a top plate joined to the frustoconical panel, the frustoconical panel and the top plate including a plurality of slots configured to allow RF energy to enter the vacuum processing space; and an RF-transmissive dielectric window positioned adjacent to said support member, said dielectric window having a frustoconical section mechanically supported by the frustoconical panel of said support member and a disk-shaped portion mechanically supported by the top plate, said dielectric window and said support member transferring RF energy, when mounted to the vacuum chamber, from an antenna to the vacuum processing space for forming a plasma from a process gas in the vacuum processing space.

27. The plasma source of claim 26, wherein said support member is formed from an electrically-conductive material.

28. The plasma source of claim 26, wherein said dielectric window is formed from an RF-transmissive material selected from the group consisting of aluminum oxide, aluminum nitride, silicon nitride, borosilicate glass, quartz and combinations thereof.

29. The plasma source of claim 26, wherein adjacent pairs of the plurality of slots are oriented substantially parallel to each other so that RF energy is transmitted from said antenna to the vacuum processing space.

* * * * *

UNITED STATES PATENT AND TRADEMARK OFFICE
CERTIFICATE OF CORRECTION

PATENT NO.     : 6,652,711 B2
DATED          : November 25, 2003
INVENTOR(S)    : Jozef Brcka et al.

It is certified that error appears in the above-identified patent and that said Letters Patent is hereby corrected as shown below:

<u>Title page,</u>
Item [*] Notice, insert -- Subject to any disclaimer, the term of this patent is extended or adjusted under 35 U.S.C. 154(b) 149 days. --

Signed and Sealed this

Second Day of March, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,652,711 B2
DATED : November 25, 2003
INVENTOR(S) : Brcka et al.

It is certified that error appears in the above-identified patent and that said Letters Patent is hereby corrected as shown below:

Column 17,
Line 50, reads "plots" and should read -- slots --.

Column 20,
Line 8, "claim 22, said" and should read -- claim 22, wherein said --.

Signed and Sealed this

Eighteenth Day of May, 2004

JON W. DUDAS
*Acting Director of the United States Patent and Trademark Office*